United States Patent [19]

(12) United States Patent
Broekaart et al.

(10) Patent No.: US 7,768,129 B2
(45) Date of Patent: Aug. 3, 2010

(54) METAL ETCHING METHOD FOR AN INTERCONNECT STRUCTURE AND METAL INTERCONNECT STRUCTURE OBTAINED BY SUCH METHOD

(75) Inventors: Marcel Eduard Broekaart, Theys (FR); Arnoud Willem Fortuin, Crolles (FR)

(73) Assignee: NXP B.V., Eindhoven (NL)

( * ) Notice: Subject to any disclaimer, the term of this patent is extended or adjusted under 35 U.S.C. 154(b) by 972 days.

(21) Appl. No.: 10/544,607

(22) PCT Filed: Feb. 3, 2004

(86) PCT No.: PCT/IB2004/000303

§ 371 (c)(1),
(2), (4) Date: Aug. 4, 2005

(87) PCT Pub. No.: WO2004/070818

PCT Pub. Date: Aug. 19, 2004

(65) Prior Publication Data

US 2006/0148251 A1    Jul. 6, 2006

(30) Foreign Application Priority Data

Feb. 7, 2003   (EP) .................................. 03290320

(51) Int. Cl.
*H01L 23/52*     (2006.01)
*H01L 23/528*    (2006.01)
*H01L 23/532*    (2006.01)
*H01L 21/3213*   (2006.01)
*H01L 21/768*    (2006.01)

(52) U.S. Cl. .............. 257/760; 257/E21.576; 257/E21.582; 257/E23.167; 438/624; 438/634

(58) Field of Classification Search ............ 438/622, 438/624, 634, 638, 672, 687, 688; 257/758, 257/760, 761, 762, 763, 764, E21.575, E21.576, 257/E21.582, E23.142, E23.154, E23.167
See application file for complete search history.

(56) References Cited

U.S. PATENT DOCUMENTS

| | | | |
|---|---|---|---|
| 5,256,597 A | 10/1993 | Gambino | |
| 5,766,974 A | 6/1998 | Sardella | |
| 5,817,572 A * | 10/1998 | Chiang et al. | 438/624 |
| 5,854,119 A * | 12/1998 | Wu et al. | 438/396 |
| 5,891,799 A * | 4/1999 | Tsui | 438/624 |
| 6,083,822 A * | 7/2000 | Lee | 438/624 |
| 6,165,891 A * | 12/2000 | Chooi et al. | 438/622 |
| 6,284,657 B1 * | 9/2001 | Chooi et al. | 438/687 |
| 6,352,921 B1 * | 3/2002 | Han et al. | 438/638 |
| 6,424,021 B1 * | 7/2002 | Liu et al. | 257/649 |
| 6,492,226 B1 | 12/2002 | Shue et al. | |
| 6,746,914 B2 * | 6/2004 | Kai et al. | 438/253 |
| 6,881,999 B2 * | 4/2005 | Lee et al. | 257/306 |
| 2002/0169090 A1 | 11/2002 | Hsue et al. | |

* cited by examiner

*Primary Examiner*—Mary Wilczewski

(57) ABSTRACT

A metal interconnects structure, comprises a substrate (11), a dielectric layer (12) lying above the substrate, a stop layer (13) for metal etching lying above the dielectric layer, a metal layer (15') lying above the stop layer, said metal layer being patterned according to a desired pattern.

20 Claims, 2 Drawing Sheets

METAL ETCHING METHOD FOR AN INTERCONNECT STRUCTURE AND METAL INTERCONNECT STRUCTURE OBTAINED BY SUCH METHOD

The present invention relates to a subtractive method for manufacturing a metal interconnect structure for use in a semiconductor device or the like, a metal interconnect structure obtained by such method, and a semiconductor device, an integrated circuit chip and an electronic apparatus comprising such a structure.

It finds applications, in particular, in the field of manufacturing of semiconductor devices.

A method for manufacturing a metal interconnects structure using a subtractive method typically comprises a step of plasma etching of a metal layer through a patterned resist layer (resist mask). Typically, the main etch has a large microloading, i.e., more metal remains in dense areas than in open areas. Therefore, the overetch has to be long to ensure the removal of any residual metal. At the same time, the overetch is supposed to remove the conductive glue and/or barrier layer, typically titanium nitride (TiN) and/or titanium (Ti), at the bottom of the metal stack. This is established by increasing the physical component of the overetch compared to the main etch. The increased physical nature of the overetch reduces the selectivity to the underlying dielectric layer. The underlying dielectric layer is made of an insulating oxide material, typically silicon oxide (SiO2).

Because of the aforementioned microloading effect the consumption of the underlying dielectric layer is larger in open areas than in dense areas. As a result, the planarity of the wafer decreases. At the same time, etching the oxide layer increases the oxygen content of the plasma thereby greatly reducing the selectivity to resist (selectivity decrease is about a factor 4). This can lead, locally, to the complete erosion of the resist mask, and hence to the etching of the top corners of the metal patterns. These drawbacks are emphasized where the overetch time is increased or its physical component enhanced.

An object of the present invention is to overcome the above-mentioned problems of the related art.

This is achieved, according to the present invention, by depositing a stop layer above the dielectric layer, which exhibits a lower etch rate compared to the dielectric layer. This stop layer is deposited before deposition of the metal layer to be etched. It is then used as stop layer for metal etching. For Al or W etching, this stop layer is preferably made of silicon carbide (SiC). However, the invention is not intended to be limited to this example.

The use of SiC as an etch stop layer is known in the prior art, e.g. from the international patent application WO 99/33102. This known use, however, is restricted to a specific application, that is etching of dielectric films to define vertical and horizontal interconnects according to the well-known dual 15 damascene technique. This technique is used to form metal interconnects by etching a dielectric (typically silicon oxide) layer to define both vertical and horizontal interconnects, then by inlaying metal into the defined patterns, and finally by removing any excess metal from the top of the structure in a planarization process. In this application, SiC may be selected as an etch stop layer for dielectric etching, because of its low dielectric constant (low-k). Such low-k property allows to reduce the capacitive coupling between interconnect lines, which may lead to cross talk and/or resistance-capacitance (RC) delay and hence degrade the overall performance of the device.

The present invention is directed to a totally different application, i.e. traditional metal deposition/etching process for subtractive forming of metal interconnects.

A first aspect of the invention thus relates to a subtractive method of manufacturing a metal interconnect structure on a substrate, comprising the steps of:
depositing a dielectric layer above the substrate;
depositing a stop layer above the dielectric layer, which exhibits a lower etch rate compared to the dielectric layer;
depositing a metal layer above the stop layer;
depositing a first resist layer above the metal layer;
patterning the first resist layer according to a first desired pattern; and,
etching the metal layer through the patterned first resist layer, while stopping on the stop layer.

Where the metal layer is typically an Al, W, copper (Cu), Ti, TiN, tantalum (Ta), or tantalum nitrite (TaN) layer and combinations thereof, the stop layer material is preferably a silicon and carbon-containing material, e.g. selected from the group comprising silicon carbide (SiC), nitrogen-containing SiC (SiCN), and boron-containing (SiBC), boron-containing SiCN (SiBCN).

The erosion of the underlying dielectric layer during metal etching is limited thanks to the lower etch rate of the stop layer. As a result, the device exhibits improved planarity after etch. Furthermore, the selectivity to resist is preserved because the underlying dielectric layer is not exposed to the plasma whereby no erosion of the top corners of the metal patterns is observed.

Another aspect of the invention relates to a metal interconnect structure obtained by a method according to the first aspect. The structure comprises:
a substrate;
a dielectric layer lying above the substrate;
a stop layer for metal etching lying above the dielectric layer which exhibits a lower etch rate compared to dielectric layer;
a metal layer lying above the stop layer;
said metal layer being patterned according to a first desired pattern.

Where the structure comprises vertical interconnects (contacts and/or vias), said dielectric layer and said stop layer may be both patterned according to a second desired pattern.

Another aspect of the invention relates to a semiconductor device comprising an interconnect structure according to the second aspect.

Another aspect of the invention relates to an integrated circuit chip comprising an interconnect structure according to the second aspect.

Another aspect of the invention relates to an electronic apparatus comprising an interconnect structure according to the second aspect, a semiconductor device according to the third aspect, or an integrated circuit chip according to the fourth aspect. Such electronic apparatus may be a cellular 4 phone, a general purpose computer, a personal digital assistant (IDA), a DVD (Digital Versatile disc) player, or the like.

Other features, advantages and/or objects of the invention will become more apparent from the following detailed description of embodiments thereof. This description is given with reference to the appended drawings wherein.

In the drawings, like reference numbers designate like parts in various Figures.

Figure 1A:
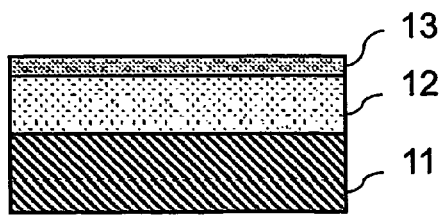
FIGS. 1A through 1H are cross-sectional diagrams illustrating a portion of a semiconductor device at respective steps of an exemplary embodiment of the manufacturing method according to the invention.

It is primarily to be observed that the invention relates to a traditional subtractive method for manufacturing a metal interconnect structure for use in a semiconductor device. Subtractive methods comprise a step of etching trenches (for wiring) in a metal layer corresponding to a given metallization level. Such method is not to be confused with the alternative well-known damascene or dual-damascene techniques, where interlevel or intralevel dielectric layers are etched instead of metal layers.

The device is typically an integrated circuit chip. By integrated circuit, it must be understood an electrical circuit formed entirely by semiconductor technology on a single chip. Of course, it is noted that the invention is not in any way intended to be limited to this example, but encompasses applications wherein, for example, the device is incorporated in a hybrid circuit, in a multichip module (CM), or mounted directly on a printed circuit board (Chip-On-Board, or COB).

The steps of the method will now be explained with reference to the flow chart of FIG. 2. In FIG. 2, the boxes corresponding to optional steps are represented in dotted lines. When appropriate, reference is made to the diagrams of FIGS. 1A-1H.

In a first step 21, a dielectric layer 12 is deposited over the upper surface of a substrate 11, e.g. a semiconductor substrate at the upper surface of which at least one component has previously been designed. Such components may comprise MOS, CMOS and/or bipolar transistors, diodes, and the like. The dielectric material is selected from a group comprising silicon oxide (SiX) such as silicon dioxide (SiO2), fluorine doped silicon dioxide also known as fluorine doped silicon glass (FSG), and carbon incorporated silicon oxide (SiOC).

In an optional planarization step 22, the dielectric layer 12 is smoothed, e.g. by a chemical-mechanical polishing (CMP) process.

In step 23, an insulating etch stop layer 13 is deposited above the dielectric layer 12. In a preferred embodiment, this etch stop layer is made of SiC. The stop layer material exhibits a lower etch rate compared to the dielectric layer. This insulating material can present a low-k characteristic (lower k-value than silicon oxide or silicon nitride), hence reducing the capacitive coupling between interconnect lines. Finally, it does not comprise any oxygen. The layer 13 is deposited over the oxide layer 12, e.g. using chemical vapor deposition (CVD) with appropriate recipe, giving the structure in FIG. 1A. As will be emphasized later, SiC layer 13 is used as a buried stop layer for later metal 15 etching.

Advantageously, the scratches induced by the dielectric layer CMP (step 22) are filled with SiC, instead of the conductive glue and/or barrier layer as by known methods. Hence, the risk of metal short is greatly reduced.

When necessary, steps 21-23 are followed by steps of forming vertical interconnects (i.e., contacts or vias) within the dielectric layer 12, to connect respective areas of the underlying layer (here the substrate 11, or alternatively an underlying metal layer corresponding to a lower metallization level).

Figure 1B:
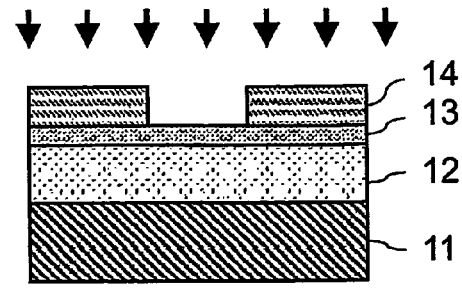
Figure 1C:
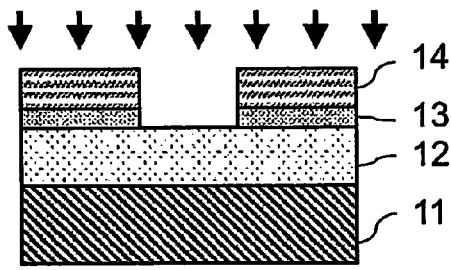
Figure 2:
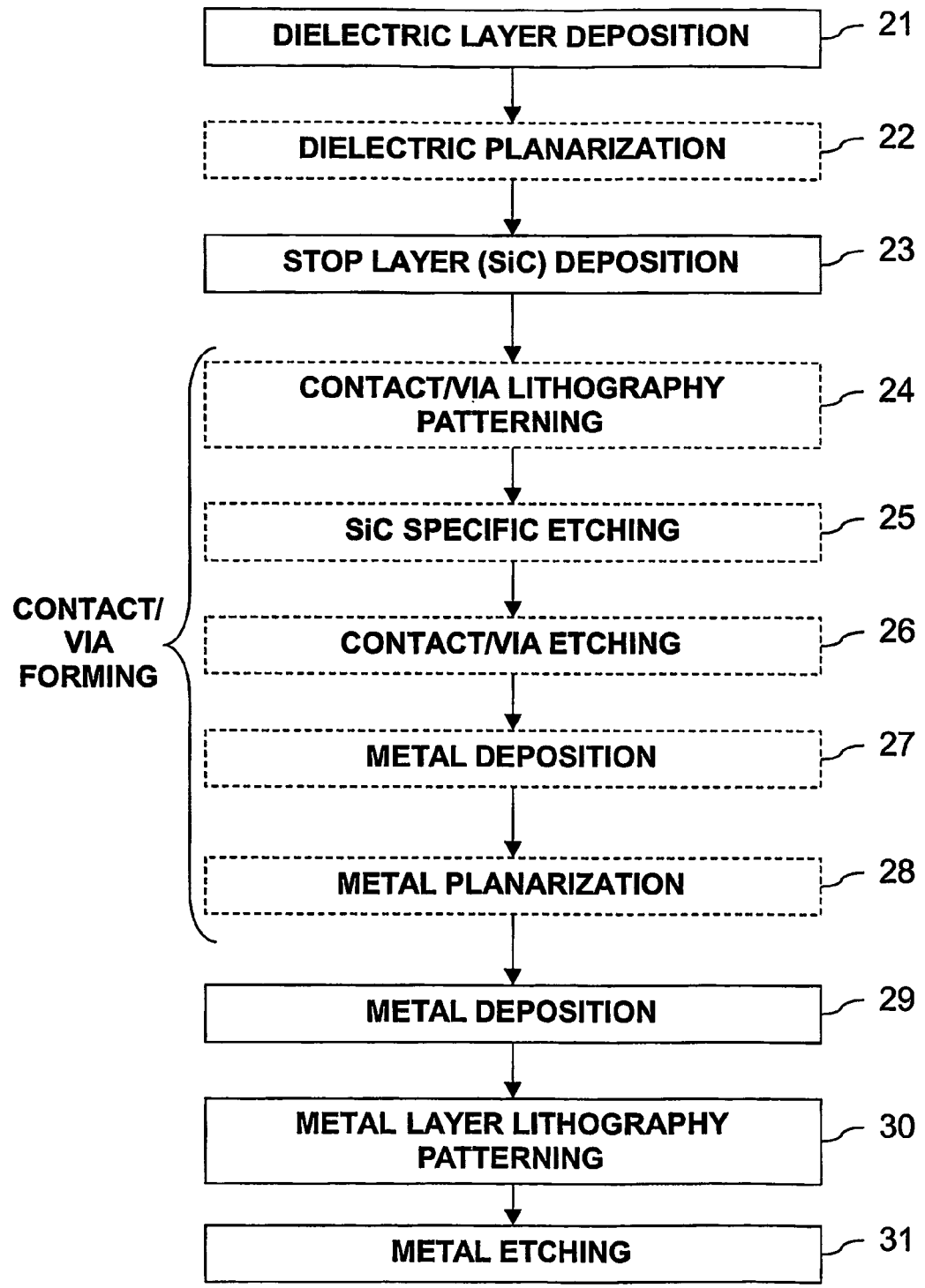
FIG. 2 is a flow chart illustrating steps of an exemplary embodiment of the method according to the invention.

Contact and via forming processes first comprise conventional steps of depositing and of patterning 24 a resist layer 14 for contact or via lithography, giving the structure of FIG. 1B. The resist layer is patterned according to the desired contact or via pattern.

In step 25, a SiC specific etching process is carried out through the openings in patterned resist layer 14, to remove the exposed portion of the SiC layer 13. Suitable methods for etching SiC are, in particular, dry etching methods, such as reactive ion etching (RIB), ion beam etching (IBE), or etching methods in the gas phase. The desired contact or via pattern is positively transferred in the SiC layer, giving the structure of FIG. 1C.

Figure 1D:
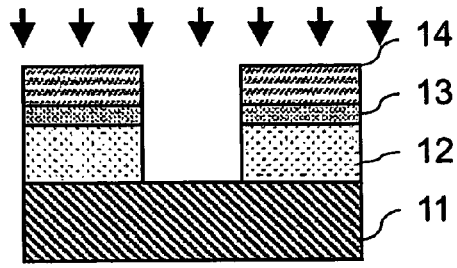

In step 26, exposed portions of the dielectric layer 12 are etched through the openings in the resist mask 14 to form contact or via holes. This etching process is performed according to a common dielectric removing process. The resulting structure is shown in FIG. 1D. The remaining resist layer 14 is then removed. Alternatively, contact or via etching may advantageously be carried out after removing the remaining resist layer, by using the patterned SiC stop layer 13 as a hard mask.

Figure 1E:
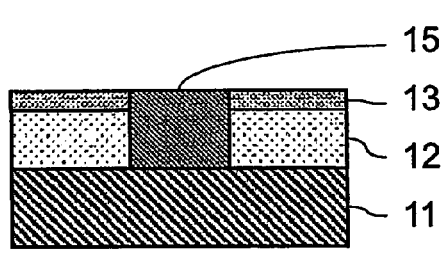

To finish the contact or via forming according to a first implementation, a conductive material, i.e. a metal such as AL W, Cu, Ti, TiN, Ta, TaN or combinations thereof, is then deposited to fill the contact or via holes (step 27) to form the contacts or vias 15. Typically, contacts and vias material comprises W. Then, in step 28, etch back or chemical-mechanical polishing is used to planarize the contacts or vias 15, while advantageously stopping on the SiC layer 13 used as a stop layer for this etch or CMP process. This provision allows to limit the erosion of the dielectric layer during the etch or CMP process. The structure thus obtained is depicted in FIG. 1E.

Typically, contacts or vias material comprise W. As is common practise, a thin Ti layer and further a thin TiN layer are deposited into the contact or via holes before tungsten deposition, to help adhesion of metal to the underlying material.

Figure 1F:
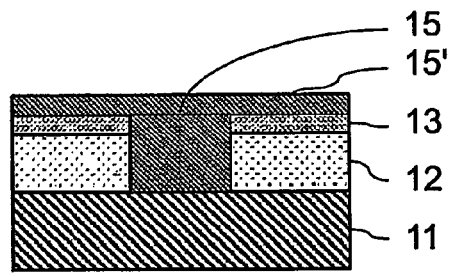

The method is then continued in step 29 by depositing a conductive material, i.e. a metal such as Al, W, Cu, Ti, TiN, Ta, TaN or combination thereof, thereby forming a metal layer 15' for horizontal interconnects (i.e., wires). In one embodiment, the metal layer 15' is applied by evaporation or sputtering. The structure thus obtained is depicted in FIG. 1F. Typically, wires material comprises Al. As is well known, a thin Ti layer and possibly also a thin layer of TiN is deposited before the Al layer 15'. Besides, another thin TiN layer might be deposited over the Al layer 15'.

Figure 1G:
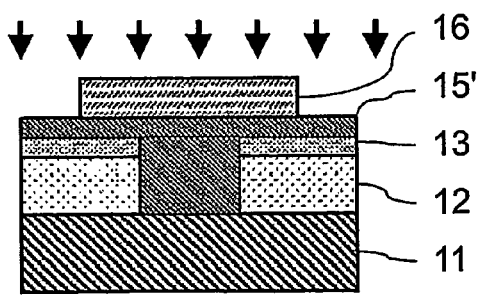
Figure 1H:
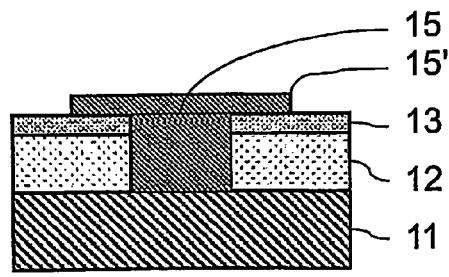

The method further comprises a step of metal layer lithography patterning. During this step, a resist layer 16 is applied above the metal layer 15'. Layer 16 is then patterned according to a conventional photolithography process to define openings corresponding to the pattern of the desired wires. The resulting structure is shown in FIG. 1G.

The method ends with step 31 where the metal layer 15' is etched through the openings in the patterned resist layer 16, while advantageously stopping on the SiC layer 13 used as a stop layer for metal etching. Step 31 typically comprises main etch and overetch substeps. The desired wires pattern is thus positively transferred in the metal layer 15'. The erosion of the underlying dielectric layer 12 is limited thanks to the remaining SiC stop layer 13. The plasma etch recipe comprises a gas mixture which typically contains halogen or halogen based gases. Where the metal to be etched is Al, the gas mixture might be selected from the group containing boron trichloride (BCl3), hydrogen chloride (or hydrochloric acid, HCl), hydrogen bromide (HBr) and hydrogen iodine (HI). Where the metal to be etched is W, the gas mixture might be sulfure hexafluoride (SF6) or other fluor-containing gases. The resist mask 16 is then removed by a process such as ashing or wet chemical stripping without damaging the underlying metal layer 15' and SiC layer 13, to produce the final structure of FIG. 1H.

Additional vias and/or wirings might be fabricated in other metallization levels by repeating the steps shown in FIGS. 1B-1H for an upper metallization level.

Steps 27 are 28 are optional. Typically, these steps are carried out unless contacts or vias are made of the same metal as wires, e.g. Al. Such being the case, the method simply jumps from step 26 to step 29.

It will be appreciated that SiC has been mentioned above only as a preferred example for the stop layer material. Other materials might be considered as possible candidates, depending on the nature of the gas mixture used for plasma etching. In particular, the stop layer material might be selected in a group of silicon-and carbon-containing materials, e.g. the group comprising SiC, SiCN, SiBC, SiBCN, and combinations thereof. Depending on its nature, the stop layer material might be deposited at step 23 by a plasma deposition method, a sputter deposition method (e.g. for SiCN), a spin-on method, or a CVD method (e.g. for SiC).

The invention claimed is:

1. Subtractive method of manufacturing a metal interconnects structure on a substrate using a metal etching process, comprising the steps of:
   depositing a dielectric layer above the substrate;
   depositing a stop layer above the dielectric layer, the stop layer exhibiting a lower etch rate compared to an etch rate of the dielectric layer using the metal etching process;
   depositing a first resist layer above the stop layer;
   patterning the first resist layer according to a first desired pattern;
   etching the stop layer through the patterned first resist layer;
   after etching the stop layer, removing the patterned first resist layer;
   etching the dielectric layer for forming contact or via holes using the patterned stop layer as a hard mask;
   depositing a metal layer above the stop layer;
   depositing a second resist layer above the metal layer;
   patterning the second resist layer according to a second desired pattern; and
   etching the metal layer through the patterned second resist layer up to the stop layer.

2. The method of claim 1, further comprising, before depositing the metal layer, the steps of:
   depositing a layer of Ti or TiN in the contact holes; and
   filling the remaining portions of the contact holes with tungsten.

3. The method of claim 1, wherein etching the metal layer includes plasma etching using a gas mixture that includes at least one of $BCl_3$, HCl, HBr, HI and $SF_6$.

4. The method of claim 1, wherein the metal layer includes at least one of Al, W, Cu, Ti, TIN, Ta and TaN.

5. The method of claim 1, further comprising, before depositing the metal layer, the steps of:
   filling the contacts holes with metal for forming contacts; and,
   planarizing the contacts by etch back or chemical-mechanical polishing and using the patterned stop layer as a stop layer.

6. The method of claim 1, wherein the stop layer material is selected from the group comprising SiC, SiCN, SiBC, SiBCN, and combinations thereof.

7. The method of claim 1, wherein the metal layer is copper.

8. Metal interconnect structure comprising:
   a substrate;
   a dielectric layer lying above the substrate;
   a stop layer for metal etching, lying above the dielectric layer, the stop layer exhibiting a lower etch rate compared to an etch rate of the dielectric layer for the metal etching, and the stop layer containing at least one of SiC, SiCN, SiBC, and SiBCN;
   a metal layer lying above the stop layer, said metal layer being patterned according to a first desired pattern.

9. The metal interconnect structure of claim 8, wherein said dielectric layer and said stop layer are both patterned according to a second desired pattern.

10. The metal interconnect structure of claim 9, wherein the patterned dielectric layer and the patterned stop layer define contacts holes filled with metal.

11. The metal interconnect structure of claim 10, wherein the metal filling the contacts holes is at least one metal selected from the group comprising Al, W, Cu, Ti, TIN, Ta, TaN and combinations thereof.

12. The metal interconnect structure of claim 10, wherein the metal filling the contacts holes tungsten and Ti or TiN.

13. The metal interconnect structure of claim 8, wherein the metal layer material is at least one metal selected from the group comprising Al, W, Cu, Ti, TIN, Ta, TaN and combinations thereof.

14. Semiconductor device comprising an interconnect structure according to claim 8.

15. Electronic apparatus comprising a semiconductor device according to claim 14.

16. Integrated circuit chip comprising an interconnect structure according to claim 8.

17. Electronic apparatus comprising an integrated circuit chip according to claim 16.

18. Electronic apparatus comprising an interconnect structure according to claim 8.

19. The metal interconnect structure of claim 8, wherein the metal layer is copper.

20. A metal interconnect structure comprising:
   a substrate;
   a dielectric layer lying above the substrate;
   a stop layer for metal etching, lying above the dielectric layer, the stop layer exhibiting a lower etch rate compared to an etch rate of the dielectric layer for the metal etching, and the stop layer containing at least one of SiC, SiCN, SiBC, and SiBCN;
   a metal layer lying above the stop layer, said metal layer being patterned according to a first desired pattern,
   wherein the metal interconnect structure is obtained by a method that includes,
   depositing the dielectric layer above the substrate;
   depositing the stop layer above the dielectric layer;
   depositing a the metal layer above the stop layer;
   depositing a first resist layer above the metal layer;
   patterning the first resist layer according to the first desired pattern; and
   etching the metal layer through the patterned first resist layer up to the stop layer.

* * * * *